United States Patent [19]

Ueno et al.

[11] Patent Number: 4,691,217
[45] Date of Patent: Sep. 1, 1987

[54] SEMICONDUCTOR INTEGRATED CIRCUIT DEVICE

[75] Inventors: Tatsuaki Ueno, Tachikawa; Hajime Inoue, Kodaira, both of Japan

[73] Assignees: Hitachi, Ltd.; Hitachi Microcomputer Engineering Ltd., both of Tokyo, Japan

[21] Appl. No.: 758,035

[22] Filed: Jul. 23, 1985

[30] Foreign Application Priority Data

Jul. 25, 1984 [JP]  Japan ................................ 59-152996

[51] Int. Cl.⁴ .......................................... H01L 29/78
[52] U.S. Cl. ............................. 357/23.13; 307/200 B; 307/568
[58] Field of Search ..................... 357/23.13; 307/568, 307/200 B

[56] References Cited

U.S. PATENT DOCUMENTS

| 3,947,727 | 3/1976 | Stewart | 307/56.8 X |
| 4,342,045 | 7/1982 | Kim | 357/23.13 |
| 4,385,337 | 5/1983 | Asano | 357/23.13 |
| 4,609,931 | 9/1986 | Koike | 357/23.13 |

FOREIGN PATENT DOCUMENTS 58-162065  9/1983  Japan ................................ 357/23.13

Primary Examiner—Martin H. Edlow
Attorney, Agent, or Firm—Antonelli, Terry & Wands

[57] ABSTRACT

Disclosed is a semiconductor integrated circuit device comprising a protective circuit including a MOSFET which is connected directly to a bonding pad and which is connected in the form of a diode, and a resistor which is connected to the bonding pad at a stage posterior to the MOSFET. A drain region of the MOSFET is connected to the bonding pad, and has a large area of at least a certain fixed value in order to raise a voltage at which a P-N junction is destroyed.

25 Claims, 8 Drawing Figures

SEMICONDUCTOR INTEGRATED CIRCUIT DEVICE

BACKGROUND OF THE INVENTION

The present invention relates to a semiconductor device, and more particularly to a technique which is effective when applied to the input protective circuit of a semiconductor device, for example, when utilized for a MIS element.

As a typical one of semiconductor integrated circuit devices (ICs) constructed of MISFETs, a MOSIC has been extensively used. In order to prevent the electrostatic destruction of the gate insulator film of a MOS element in the MOSIC, various protective circuits have been proposed.

The protective circuit is connected between an internal circuit and a bonding pad to which an input signal is applied (an input bonding pad). The protective circuit is disposed in order that abnormal energy, e. g., electrostatic energy applied to the input bonding pad may be absorbed into a semiconductor substrate or a well region so as to blunt the rise of an abnormal input waveform.

FIG. 8 shows a typical protective circuit for use in a CMOSIC. Numeral 1 designates that input gate of an internal circuit which is composed of a P-channel MOS transistor (FET) 2 and an N-channel MOS transistor (FET) 3. An N-channel MOS transistor 5 is connected to the input side of the input gate 1 of the internal circuit. The N-channel MOS transistor 5 forms an equivalent MOS diode 6 for clamping an input signal. The MOS diode 6 discharges charges into a semiconductor substrate from the P-N junction portion between the semiconductor substrate and a semiconductor region as a source or drain region and from the surface portion of the semiconductor substrate lying in contact with a gate oxide film. Further, a protective resistor 8 made of a semiconductor region, which is formed in the semiconductor substrate and which is opposite in conductivity type thereto, is serially connected between the clamping MOS transistor 6 and a bonding pad 7. The protective resistor 8 reduces current to be applied to the clamping MOS transistor 6, and also blunts the rise of any abnormal input signal. This protective resistor 8 is formed by the same step as that for forming the semiconductor region which serves as the source or drain region of the MOS transistor.

The inventor's study has revealed that problems to be stated below are involved in such input protective circuit employing the semiconductor region as the protective resistor. The semiconductor region being the protective resistor has shallow owing to fineprocessing in recent years. For this reason, the destruction of the junction portion of the semiconductor region being the protective resistor is prone to occur around the contact portion between the bonding pad 7 and the semiconductor region. In order to deepen only this semiconductor region (the protective resistor 8), an additional mask is needed in the process of manufacture, which is problematic in production.

Meanwhile, in a case where the protective resistor is made of polycrystalline silicon, there is the problem that it is less immune to the mode of high voltage destruction, namely, that the polycrystalline silicon is fused by heat ascribable to power dissipation. Further, in a case where silicidation is performed for attaining a higher speed, there is the problem that the resistance of the protective resistor decreases.

The gate protective circuit of a CMOSIC is described in, for example, 'NIKKEI ELECTRONICS' published by NIKKEI McGraw-Hill Inc., dated Jan. 31, 1983, p. 138.

SUMMARY OF THE INVENTION

An object of the present invention is to provide a technique which can enhance the electrostatic destruction voltage of a protective circuit for a MIS element or a MISIC.

Another object of the present invention is to provide a technique which can prevent the destruction of the junction portion of a semiconductor region being the protective resistor of an input protective circuit and which prevents the fusion of a polycrystalline silicon resistor due to heat.

The above-mentioned and other objects and novel features of the present invention will become apparent from the description of this specification and the accompanying drawings.

Typical aspects of performance of the present invention will be briefly summarized below.

In order to prevent the electrostatic destruction of an internal circuit having a MIS type element, a protective element of MIS structure is connected to an input bonding pad directly without interposing a resistor therebetween. One of the semiconductor regions of the protective element of the MISFET structure has its area enlarged, and this semiconductor region is connected with the input bonding pad. Further, the gate electrode and the other semiconductor region of the protective element of the MISFET structure are fixed to a fixed potential. Therefore, even when an external abnormal potential enters the input bonding pad, charges per unit area are reduced in dispersed fashion and discharged into a substrate or a well by the one semiconductor region of comparatively large area. Accordingly, the electrostatic breakdown voltage of an input protective circuit is enhanced.

In a case where a protective resistor is serially connected between the input bonding pad and the internal circuit, it can be made of either a semiconductor region or polycrystalline silicon without any problem. In the case of using the semiconductor region, abnormal energy (current) is already absorbed to some extent by the protective element of the MISFET structure, so that even when the semiconductor region is shallow, the junction portion thereof is not destroyed. Further, the decrease of a resistance attributed to a silicide can be coped with by employing the semiconductor region as the protective resistor. In addition, in the case of using the polycrystalline silicon, the protective resistor is not subject to thermal fusion for the same reason as that of the semiconductor region.

DESCRIPTION OF THE PREFERRED EMBODIMENTS

Now, a first embodiment of a semiconductor integrated circuit device according to the present invention will be described with reference to FIGS. 1 to 3.

Figure 1:
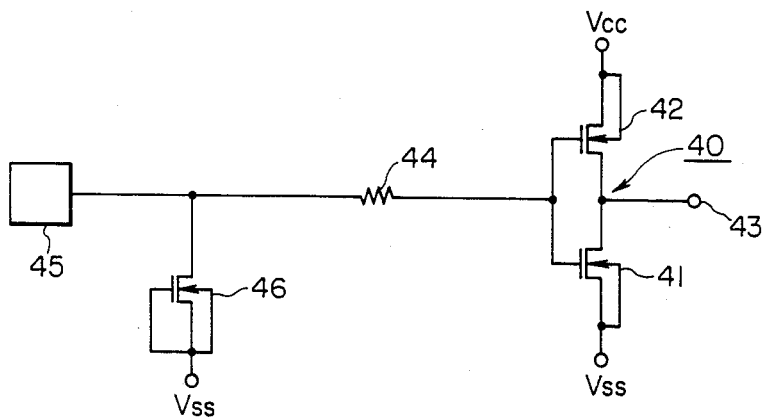
FIG. 1 is a diagram showing a protective circuit according to the present invention.

FIG. 1 is a circuit diagram showing a portion to which the present invention is applied. Numeral 45 designates a bonding pad, which is supplied with an input signal voltage from outside the semiconductor integrated circuit device. Electrostatic energies of high levels (charges) are liable to be applied to the bonding pad 45 by various causes. Numeral 40 indicates the input gate of the first stage of an internal circuit. The input gate 40 is composed of an N-channel MOS transistor 41 and a P-channel MOS transistor 42. The respective drain regions of the N- and P-channel MOS transistors 41 and 42 are connected in common, and the common output thereof is connected to the internal circuit (not shown) through a terminal 43. Both the gate electrodes of the MOS transistors 41 and 42 are connected to one end of a protective resistor 44. The source regions of the N- and P-channel MOS transistors 41 and 42 are respectively connected to the ground potential $V_{SS}$(O V) and a power source potential $V_{CC}$(+5 V).

The other end of the protective resistor 44 is connected to the input bonding pad 45. A protective element 46 of a MISFET structure is connected to the input bonding pad 45, namely, the other end side of the protective resistor 44. The source region and gate electrode of the protective element 46 made up of an N-channel MOS transistor are both connected to the ground potential $V_{SS}$. One of two semiconductor regions, which are the source and drain regions of the N-channel MOS transistor 46, has a large area and is connected to the bonding pad 45 as well as the other end of the protective resistor 44. That is, the excessive energy having entered the bonding pad 45 is first applied to the one semiconductor region of the N-channel MOS transistor 46. The protective element 46 needs to have its one terminal connected between the protective resistor 44 and the bonding pad 45.

In such construction, the abnormal energy (charges) applied to the bonding pad 45 is dispersed and then discharged into a semiconductor substrate through the junction portion of the one semiconductor region of the N-channel MOS transistor 46 and the surface portion of the semiconductor substrate underlying the gate electrode.

Figure 2:
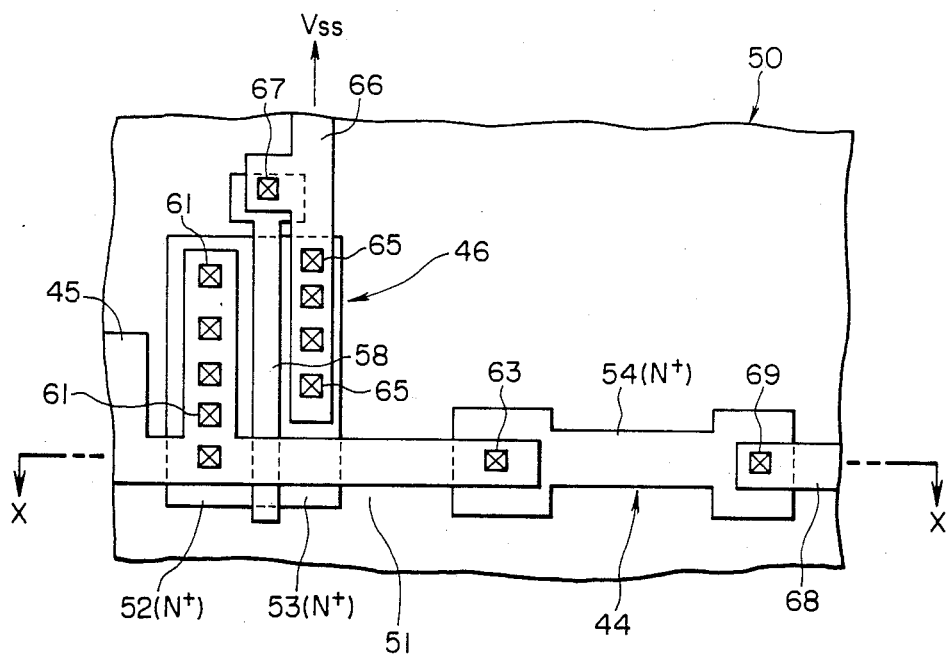
FIGS. 2 and 3 are a plan view and a sectional view of a semiconductor device which employs the input protective circuit in FIG. 1, respectively.
Figure 3:
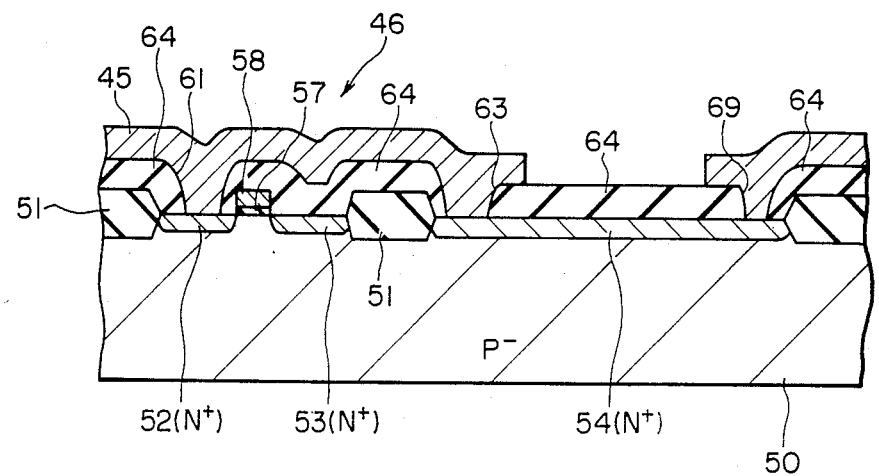

In order to describe this operation of the present invention more in detail, reference will be had to a plan view and a sectional structural view respectively shown in FIG. 2 and FIG. 3.

FIG. 3 is the sectional view taken and seen along line X—X in FIG. 2. In FIG. 2, insulator films 57 and 64 are omitted. In both the figures, the protective resistor illustrated in FIG. 1 is formed of a semiconductor region 54.

In FIGS. 2 and 3, numeral 50 designates a semiconductor substrate which is made of a P-type silicon single crystal. The N-channel MOS transistor 46 which is the protective element, and the protective resistor 44 are formed in an active region which is surrounded with a thick field insulator film ($SiO_2$ film) 51. The N-channel MOS transistor 46 is formed of $N^+$-type semiconductor regions 52 and 53 being the drain and source regions, the gate insulator film 57 and the gate electrode 58. The protective resistor 44 is formed of the $N^+$-type semiconductor region 54 as stated above. The gate insulator film 57 and the gate electrode 58 are respectively made of a silicon oxide film and a polycrystalline silicon film.

The $N^+$-type semiconductor region 52, which is the source or drain of the N-channel MOS transistor 46, is connected through contact holes 61 to the input bonding pad 45 made of aluminum. The input bonding pad 45 is connected through a contact hole 63 to one end side of the $N^+$-type semiconductor region 54 which is the protective resistor. Shown at numeral 64 is an interlayer insulator film which is made of PSG (phosphosilicate glass) or the like. In addition, the source or drain 53 of the N-channel MOS transistor 46 is connected through contact holes 65 to an aluminum wiring 66 which serves to supply the ground potential being a reference potential. The gate electrode 58 of the N-channel MOS transistor 46 is further connected to the wiring 66 through a contact hole 67. The other end side of the $N^+$-type semiconductor region 54 being the protective resistor, and an aluminum wiring 68 are connected through a contact hole 69. The wiring 68 is connected to the gate electrodes of the MOSFETs 41 and 42.

In the embodiment which employs the protective element formed of the N-channel MOS transistor 46, the area of one semiconductor region 52 needs to be comparatively large. Although the details will be discussed later, this applies also to a type which employs protective elements formed of complementary MOS transistors.

In the ensuing description, that semiconductor region of the MOSFET being the protective element which is connected to the bonding pad shall be called the "drain region" for the sake of convenience.

Figure 7:
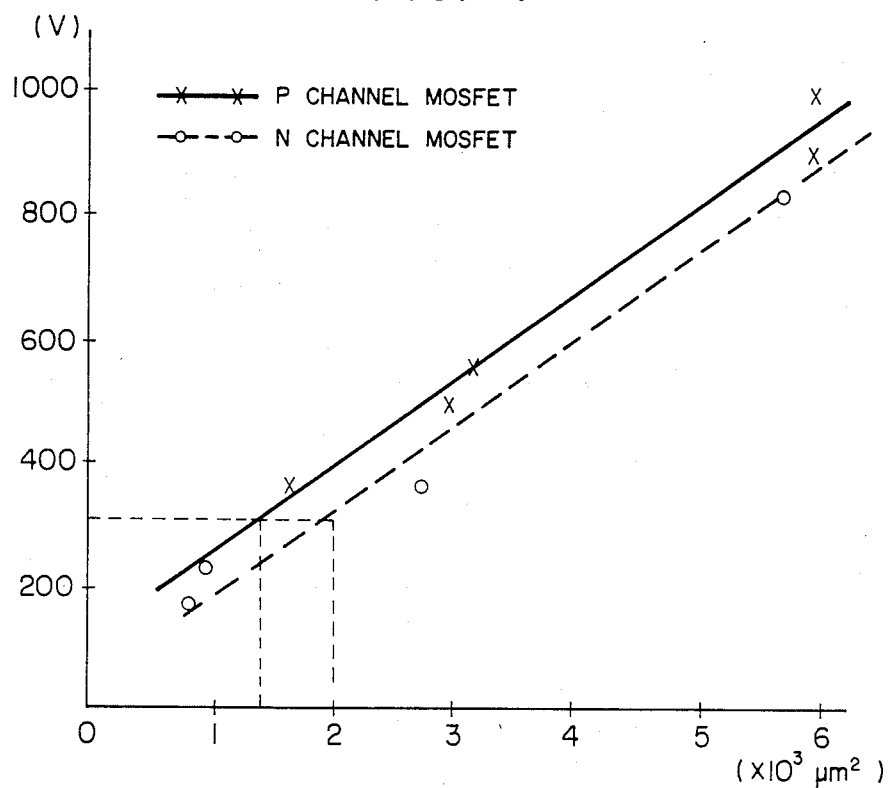
FIG. 7 is a graph showing the relationships between the areas of the semiconductor regions of protective elements having a MISFET structure and the electrostatic destruction voltages.
Figure 8:
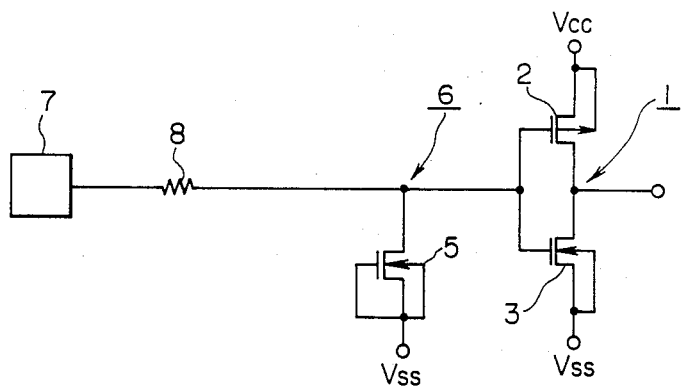
FIG. 8 is a diagram showing an input protective circuit in a prior art.

How the area of the drain region and the voltage applied to the input bonding pad affect the electrostatic destruction voltage of the P-N junction between the drain region and the semiconductor substrate was experimentally investigated, and the results are shown in FIG. 7.

In FIG. 7, the axis abscissas represents the area ($\times 10^3$ $\mu m^2$) of the drain region, while the axis of ordinates represents the voltage (V) applied to the input bonding pad. Mark o indicates the voltage at which the P-N junction between the drain region 52 of the N-channel MOS transistor 46 and the semiconductor substrate 50 was electrostatically destroyed. It is seen that the N-channel MOS transistors have the electrostatic destruction voltages of values approximately indicated by a broken line in accordance with the drain areas. It is accordingly understood that, in order to attain an electrostatic destruction voltage of at least 300 V by way of example, the area of the drain region may be approximately 2000 $\mu m^2$ or more in the N-channel MOS transistor. By affording such area of the drain region, the charges from the bonding pad are dispersed, and simultaneously, the region in which the surface breakdown arises can be rendered long, so that the electrostatic destruction voltage can be enhanced.

Figure 4:
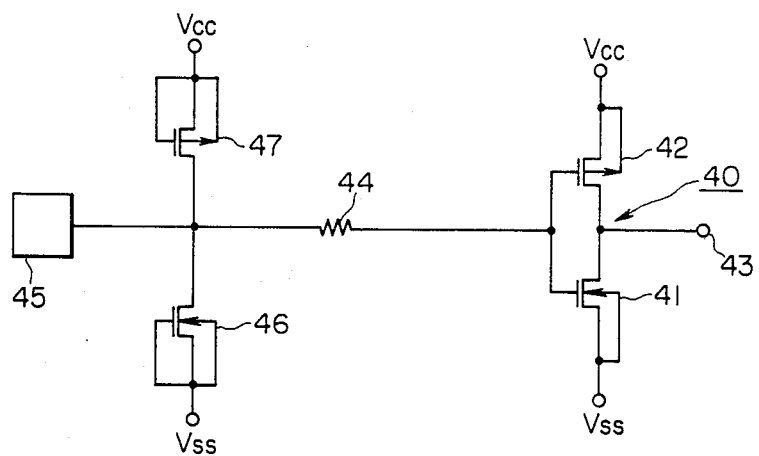
FIG. 4 is a diagram showing another embodiment of the protective circuit of the present invention.

A second embodiment will be described with reference to FIGS. 4 to 6.

The second embodiment is an example of a semiconductor device which employs protective elements formed of complementary MOS transistors. That is, the second embodiment is such that a protective element 47 formed of a P-channel MOS transistor is added to the first embodiment. Accordingly, portions having the same functions as in the first embodiment are assigned the same symbols and shall not be repeatedly explained.

Two protective elements 46 and 47 having the MISFET structure are connected to an input bonding pad 45, namely, the other end side of a protective resistor 44. The source region, gate electrode and P⁻ well region of the protective element 46 formed of an N-channel MOS transistor are all connected to the ground potential $V_{SS}$, while the source region and gate electrode of the protective element 47 formed of a P-channel MOS transistor, and a semiconductor substrate are all connected to a power source potential $V_{CC}$. The respective drain regions of the N- and P-channel MOS transistors 46 and 47, which are semiconductor regions having comparatively large areas, are connected in common and then connected to the bonding pad 45 as well as the other end of the protective resistor 44.

In such construction, abnormal energy (charges) applied to the bonding pad 45 is dispersed and discharged into the well region and the semiconductor substrate through the junction portions of the drain regions of the N- and P-channel MOS transistors 46 and 47 and the surface portions of the semiconductor substrate and the well region underlying the gate electrodes of both the MOS transistors.

Figure 5:
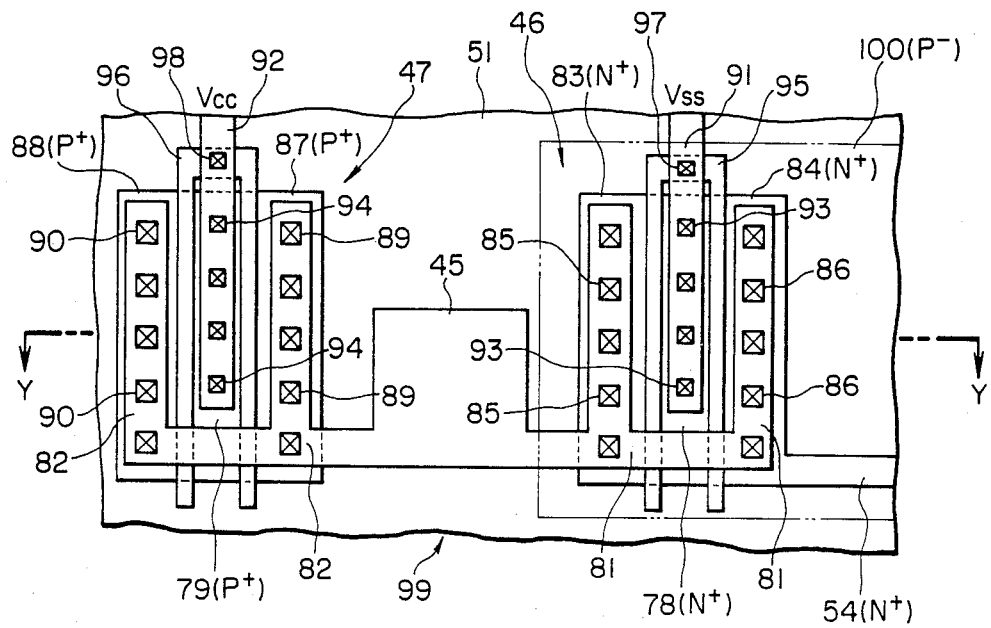
FIGS. 5 and 6 are a plan view and a sectional view of a semiconductor device which employs the protective circuit in FIG. 4, respectively.
Figure 6:
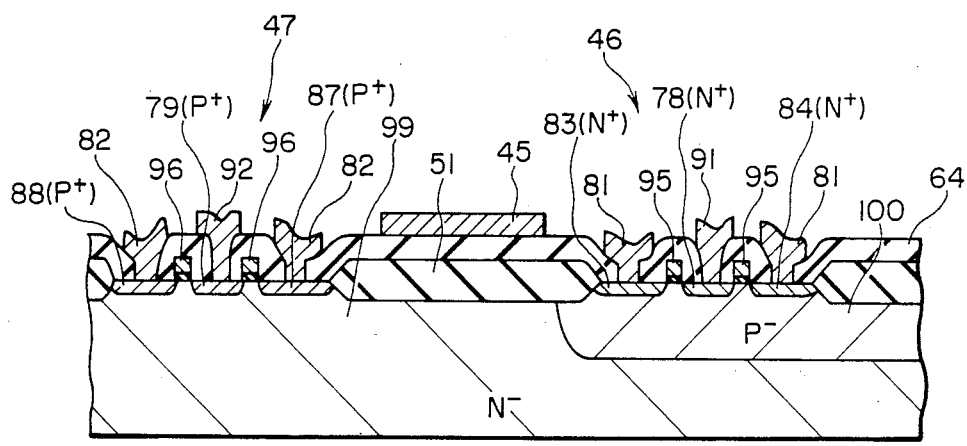

In order to describe this operation of the present invention more in detail, reference will be had to a plan view and a sectional structural view respectively shown in FIG. 5 and FIG. 6.

The sectional structural view of FIG. 6 is taken and seen along line Y—Y in FIG. 5. An insulator film 64 is omitted from FIG. 5. The protective resistor illustrated in FIG. 4 is formed of a semiconductor region.

Referring to FIGS. 5 and 6, the N-channel MOS transistor 46 and the P-channel MOS transistor 47 are arranged on both the sides of the input bonding pad 45. The drain regions of the P- and N-channel MOS transistors 47 and 46 are connected to the bonding pad 45, and each drain region is divided in two in this embodiment. More specifically, the N-channel MOS transistor 46 has first and second N⁺-type drain regions 83 and 84. The regions 83 and 84 are respectively connected to an aluminum wiring 81 through contact holes 85 and 86, and the wiring 81 is connected to the bonding pad 45 similarly made of aluminum. On the other hand, the P-channel MOS transistor 47 has first and second P⁺-type drain regions 87 and 88. The regions 87 and 88 are respectively connected to an aluminum wiring 82 through contact holes 89 and 90. The wiring 82 is connected to the bonding pad 45. Each of the gate electrodes 95 and 96 of the respective MOS transistors 46 and 47, which are made of polycrystalline silicon, is formed in the shape of letter U in order to render the drain regions large in area without lowering the density of integration of the semiconductor device. Numerals 91 and 92 indicate an wiring for applying the ground potential of a reference potential and an wiring for applying the power source voltage, respectively. The respective wiring 91 and 92 are connected to the N⁺-type source region 78 of the N-channel MOS transistor 46 and the P⁺-type source region 79 of the P-channel MOS transistor 47 through contact holes 93 and 94. The gate electrodes 95 and 96, which are formed on the surface parts of the semiconductor substrate between the drain regions and the source regions, are respectively connected to the corresponding wiring 91 and 92 through contact holes 97 and 98. The N⁺-type semiconductor region 54 which is the protective resistor 44 is connected with the input bonding pad 45 through the contact holes 86. In addition, numeral 99 indicates the N-type silicon semiconductor substrate, and numeral 100 the P-type well region.

In the layout of FIG. 5, the drain region 83 of the N-channel MOS transistor 46 and the drain region 87 of the P-channel MOS transistor 47 should preferably be spaced a predetermined distance in order to prevent latch-up.

Although the semiconductor region 54 has been used as the protective resistor 44 in each of the first and second embodiments, a polycrystalline silicon resistor may be similarly used without any hindrance.

In the case of employing the protective elements formed of the complementary MOS transistors, the areas of the N⁺-type drain regions 83 and 84 and the P⁺-type drain regions 87 and 88 need to be large.

How the areas of the drain regions and the voltage applied to the input bonding pad affect the electrostatic destruction voltages of the P-N junctions between the drain regions and the semiconductor substrate and well region, will be described with reference to FIG. 7.

The voltage at which the P-N junction between the N⁺-type drain region 83 or 84 and the P-type well region 100 was electrostatically destroyed, is substantially equal to a value indicated by mark o in FIG. 7. Such voltages are somewhat different depending upon the difference of the impurity concentrations of the P⁻-type well region 100 and the P-type semiconductor substrate 50 of the first embodiment.

Indicated by mark x is the voltage at which the P-N junction between the P⁺-type drain region 87 or 88 of the P-channel MOS transistor 47 and the N⁻-type semiconductor substrate 99 was electrostatically destroyed. It is seen that the P-channel MOS transistors have the electrostatic breakdown voltages of values approximately indicated by a solid line in accordance with the drain areas. It is accordingly understood that, in order to attain an electrostatic breakdown voltage of at least 300 V by way of example, the drain area may be approximately 2000 $\mu m^2$ or more in the N-channel MOS transistor, while it may be approximately 1500 $\mu m^2$ or more in the P-channel MOS transistor. The reason why the area may be smaller in the P-channel MOSFET, will be that the slope of the impurity concentration distribution is gentler owing to the higher diffusion coefficient of boron. In the second embodiment, the N- and P-channel MOS transistors may respectively have the drain regions (the semiconductor regions connected to the input bonding pad) whose areas are at least 2000 $\mu m^2$ and 1500 $\mu m^2$. By affording such areas, the charges from the bonding pad are dispersed, and simultaneously, the lengths of the regions in which the surface breakdown arises can be increased, so that the electrostatic destruction voltages can be enhanced.

In the second embodiment, in order to realize the drain region of the large area without lowering the density of integration, each gate electrode is put into the shape of letter U, and the bisected drain regions are arranged on both the sides (two sides opposing to each other) of the corresponding source region in a manner to sandwich the gate electrode therebetween.

According to the present invention, the following effects are achieved:

(1) One semiconductor region of a protective element formed of a MISFET is connected directly to a bonding pad, and the area of this semiconductor region is rendered comparatively large, so that charges can be dispersed and then discharged into a semiconductor substrate or a well region from the junction portion of the protective element formed of the MISFET and from the portion thereof in which breakdown arises. Therefore, the electrostatic destruction voltage of an input protective circuit is enhanced.

(2) In case of employing a resistor made of a semiconductor region as a protective resistor, even when the junction depth of this semiconductor region is shallow, a semiconductor device of high density of integration is produced because it is protected by the protective element formed of the MISFET for the reason stated above. Likewise, the thermal fusion of a resistor made of polycrystalline silicon can be checked, which brings forth the effect that low-resistance polycrystalline silicon owing to silicidation can be readily realized.

(3) Since the large-area semiconductor region of the protective element formed of the MISFET is connected between the protective resistor and the bonding pad, the fusion of the protective resistor or the destruction of the junction can be prevented when an excessive current or an excessive voltage has entered.

While, in the above, the invention made by the inventor has been concretely described in conjunction with embodiments, it is needless to say that the present invention is not restricted to the foregoing embodiments, but that it can be variously modified within a scope not departing from the purport thereof.

For example, an internal circuit may well be a circuit which includes an N-channel MISFET or a bipolar transistor and a MISFET. An input protective resistor may well be made of polycrystalline silicon. A bonding pad may be in any shape as long as it is a terminal to which a voltage is applied from outside an IC chip.

A fixed voltage to be applied to the gate electrode of a MISFET being a protective element may well differ from a fixed voltage to be applied to a region which is either a source or drain region which is not connected to the bonding pad.

The present invention can be extensively utilized for a semiconductor device employing a MIS element and an integrated circuit employing MIS elements, and is effective especially when applied to products of high densities of integration.

We claim:

1. A semiconductor integrated circuit device comprising:
an input terminal which serves to receive an input signal from external of the device and apply the signal to the remainder of the device;
a circuit which is composed of first MISFETs connected to said input terminal, a gate electrode of at least one of said first MISFETs being connected to said input terminal; and
a protective circuit which is connected between said input terminal and said circuit and which includes a resistor and a second MISFET, the second MISFET having two semiconductor regions constituting source and drain regions of the second MISFET, and having a gate electrode, said drain region of said second MISFET being directly connected to said input terminal at a position closer thereto than the position at which the input terminal is connected to said resistor, the gate electrode and the source region of the second MISFET being connected to a fixed potential.

2. A semiconductor integrated circuit device according to claim 1, wherein the drain region of said second MISFET has an area of at least approximately 1500 $\mu m^2$.

3. A semiconductor integrated circuit device according to claim 1, wherein said second MISFET is a P-channel MISFET.

4. A semiconductor integrated circuit device according to claim 1, wherein said second MISFET is an N-channel MISFET, and said drain region of said second MISFET has an area of at least approximately 2000 $\mu m^2$.

5. A semiconductor integrated circuit device according to claim 1, wherein said drain region of said second MISFET is larger in area than the area of said source region of said second MISFET, when viewed in plan.

6. A semiconductor integrated circuit device according to claim 1, wherein the fixed potential to which both the gate electrode and the source region of the second MISFET are connected is the same fixed potential for each.

7. A semiconductor integrated circuit device according to claim 6, wherein said fixed potential is a ground potential.

8. A semiconductor integrated circuit device according to claim 1, wherein said gate electrode of said second MISFET is made of polycrystalline silicon.

9. A semiconductor integrated circuit device according to claim 8, wherein said source and drain regions of said second MISFET are provided in a semiconductor substrate, and said resistor is provided in a semiconductor region in said semiconductor substrate.

10. A semiconductor integrated circuit device according to claim 8, wherein said resistor is made of polycrystalline silicon.

11. A semiconductor integrated circuit device according to claim 1, wherein said drain region of said second MISFET is connected to the input terminal by an aluminum line.

12. A semiconductor integrated circuit device comprising;
an input terminal which serves to receive an input signal from external of the device and apply the input signal to the remainder of the device;
a circuit which is composed of first MISFETs connected to said input terminal, a gate electrode of at least one of said first MISFETs being connected to said input terminal; and
a protective circuit which is connected between said input terminal and said circuit and which includes a resistor and a second MISFET, the second MISFET having two semiconductor regions constituting source and drain regions of the second MISFET and having a gate electrode, said drain region of said second MISFET being directly connected to said input terminal at a position closer thereto than the position at which the input terminal is connected to said resistor, the drain region having an area, when viewed in plan, that is larger than the area of the source region when viewed in plan.

13. A semiconductor integrated circuit device according to claim 12, wherein said drain region of said second MISFET is connected to the input terminal by an aluminum line.

14. A semiconductor integrated circuit device according to claim 12, wherein the gate electrode of the second MISFET is U-shaped, with the source region of the second MISFET being located between the two legs of the U-shaped second MISFET, and with the drain region of the second MISFET including two sub-regions, the sub-regions respectively being located outside of the two legs of the U-shaped second MISFET.

15. A semiconductor integrated circuit device comprising:
an input terminal which serves to receive an input signal from external of the device and apply the input signal to the remainder of the device;
a circuit having a first P-channel MISFET and a first N-channel MISFET, drain regions of the first P-channel MISFET and the first N-channel MISFET being connected in common, and gate electrodes of the first P-channel MISFET and the first N-channel MISFET being connected in common and connected to said input terminal; and
a protective circuit which is connected between said input terminal and said circuit and which includes a resistor and a second P-channel MISFET and a second N-channel MISFET, each second P-channel MISFET and second N-channel MISFET having two semiconductor regions as a source region and a drain region, and a gate electrode, said drain regions of said the second P-channel MISFET and the second N-channel MISFET being directly connected to said input terminal at a position closer thereto than the position at which said resistor is connected to the input terminal, and wherein said gate electrode and said source region of said the second P-channel MISFET are connected to a first fixed potential, and said gate electrode and said source region of said the second N-channel MISFET are connected to a second fixed potential.

16. A semiconductor integrated circuit device according to claim 15, wherein the drain regions of the second N-channel and second P-channel MISFETs have areas of at least approximately 2000 $\mu m^2$ and at least approximately 1500 $\mu m^2$ respectively.

17. A semiconductor integrated circuit device according to claim 15, wherein fixed potentials are applied to said N- and P-channel MISFETs, the fixed potentials being a ground potential applied to said N-channel MISFET and a power source potential applied to said P-channel MISFET.

18. A semiconductor integrated circuit device according to claim 17, wherein the drain regions of the second N-channel and second P-channel MISFETs have areas of at least approximately 2000 $\mu m^2$ and at least approximately 1500 $\mu m^2$ respectively.

19. A semiconductor integrated circuit device according to claim 15, wherein said gate electrodes of the second P-channel MISFET and the second N-channel MISFET are made of polycrystalline silicon.

20. A semiconductor integrated circuit device according to claim 19, wherein said source and drain regions of said second N-channel MISFET and said second P-channel MISFET are provided in a semiconductor substrate, and said resistor is provided in a semiconductor region in said semiconductor substrate.

21. A semiconductor integrated circuit device according to claim 19, wherein said resistor is made of polycrystalline silicon.

22. A semiconductor integrated circuit device according to claim 15, wherein the drain regions of each of the second N-channel MISFET and second P-channel MISFET include two sub-regions, the gate electrodes of each of the second N-channel MISFET and second P-channel MISFET are U-shaped and extend between the respective two sub-regions of the drain regions, and wherein the source regions of the respective second N-channel MISFET and second P-channel MISFET extend between the two legs of the U-shaped gate electrodes.

23. A semiconductor integrated circuit device according to claim 15, wherein one of the second N-channel MISFET and second P-channel MISFET is formed in a semiconductor substrate, and the other of the second N-channel MISFET and second P-channel MISFET is formed in a well region formed in said semiconductor substrate.

24. A semiconductor integrated circuit device according to claim 23, wherein the second N-channel MISFET is formed in a P-type well region formed in an N-type semiconductor substrate, and the second P-channel MISFET is formed in the N-type semiconductor substrate.

25. A semiconductor integrated circuit device according to claim 15, wherein said drain region of said second MISFET is connected to the input terminal by an aluminum line.

* * * * *